(12) United States Patent
Livesay et al.

(10) Patent No.: US 8,348,474 B1
(45) Date of Patent: ***Jan. 8, 2013

(54) LED LIGHT RECYCLING CAVITY WITH INTEGRATED OPTICS

(75) Inventors: William Livesay, San Diego, CA (US); Scott M. Zimmerman, Basking Ridge, NJ (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/200,872

(22) Filed: Oct. 3, 2011

Related U.S. Application Data

(66) Continuation-in-part of application No. 12/154,314, filed on May 21, 2008, now Pat. No. 8,029,164, Substitute for application No. 60/931,256, filed on May 22, 2007.

(60) Provisional application No. 60/931,094, filed on May 21, 2007.

(51) Int. Cl.
*F21V 7/00* (2006.01)
(52) U.S. Cl. ...................................................... 362/310
(58) Field of Classification Search ................... 362/310
See application file for complete search history.

(56) References Cited

U.S. PATENT DOCUMENTS

| | | | |
|---|---|---|---|
| 6,869,206 B2 | 3/2005 | Zimmerman et al. | |
| 6,960,872 B2 | 11/2005 | Beeson et al. | |
| 7,040,774 B2 | 5/2006 | Beeson et al. | |
| 7,048,385 B2 | 5/2006 | Beeson et al. | |
| 8,029,164 B2 * | 10/2011 | Livesay et al. | 362/310 |
| 8,029,165 B2 * | 10/2011 | Livesay et al. | 362/310 |
| 2003/0205400 A1 * | 11/2003 | Pritchett et al. | 174/52.4 |
| 2007/0206390 A1 * | 9/2007 | Brukilacchio et al. | 362/555 |
| 2009/0316406 A1 | 12/2009 | Livesay et al. | |

* cited by examiner

*Primary Examiner* — William Carter
(74) *Attorney, Agent, or Firm* — William Propp, Esq.

(57) ABSTRACT

A light emitting diode light source and reflective elements are directly attached or surface mounted to a foldable connector which, when folded, forms both a light recycling cavity and an optical taper at the end of the light recycling cavity.

14 Claims, 11 Drawing Sheets

LED LIGHT RECYCLING CAVITY WITH INTEGRATED OPTICS

REFERENCE TO PRIOR APPLICATION

This application claims the benefit of U.S. Provisional Patent Application Ser. No. 60/931,094, filed on May 21, 2007, and U.S. Provisional Patent Application Ser. No. 60/931,256, filed on May 22, 2007, which are herein incorporated by reference. This application is a continuation-in-part of U.S. patent application Ser. No. 12/154,314 entitled "IMPROVED LIGHT RECYCLING CAVITY WITH INTEGRATED OPTICS," filed May 21, 2008 now U.S. Pat. No. 8,029,164, which is herein incorporated by reference, and claims benefit therefrom.

BACKGROUND OF THE INVENTION

A means of generating a high brightness light source using light emitting diodes in a light recycling cavity has been shown in U.S. Pat. Nos. 6,869,206, 6,960,872, and 7,040,774. However, to effectively couple these light sources into optical systems typically requires a means of collecting the light emitting from the light recycling cavity and collimating it to an angle within the acceptance angle of an external optical system.

In the prior art, optical tapers or tunnels are used to provide this collimation of the light exiting the light recycling cavity. These optical tunnels are appended onto the output of the light recycling cavity.

It would be desirable to have a simplified means like a foldable light recycling cavity method to form an integrated optical taper and light recycling cavity. In the prior art, optical tunnels had to be carefully aligned and positioned and somehow attached to the output of the light source or light recycling cavity.

It would be desirable to have a method wherein the light recycling cavity and the optical taper are the same element. This would eliminate subsequent fabrication, alignment and assembly issues in forming a completed high volume manufacturable assembly.

SUMMARY OF THE INVENTION

An integrated optical taper/tunnel and LED light recycling cavity is described wherein the optical tunnel and the light recycling cavity are the same element. In one embodiment of the invention, a foldable LED light recycling cavity forms an optical tunnel at the output aperture of the cavity.

Mirrored surfaces are fabricated in a planar process on the same substrate (LED submount) of a foldable LED light recycling cavity.

The submount is scribed, however, the dimensions of the submount are extended in the direction of the output of the light recycling cavity. The portion of the submount that extends beyond the LED is covered or coated with a mirror or mirror finish. Further, the substrate is scribed to enable folding to form the cavity. For this present invention, the scribe lines are made at slight angles to each other such that when the substrate is folded it forms a tapered optical tunnel extending beyond the output edge of the LED light recycling cavity. This allows for a simple process to form both the optical taper, light recycling cavity and electrical interconnects utilizing a planar process with very few steps. This also provides for self-alignment of the LEDs to each other and to the optical taper when the cavity is folded. The LEDs are direct attach LEDs or surface mount LEDs.

DETAILED DESCRIPTION OF THE PREFERRED EMBODIMENTS

This invention uniquely combines an optical tunnel taper and light recycling cavity and light extraction means thereof into a one piece integrated assembly. Additional embodiments of the invention are shown that provide improved light extraction and homogenization of light generated with a light recycling cavity.

This invention discloses a means of forming a light recycling cavity with integrated optical taper such that the light recycling cavity and optical taper are fabricated on one contiguous planar substrate which, when folded, forms both the light recycling cavity and optical taper.

Figure 1A:
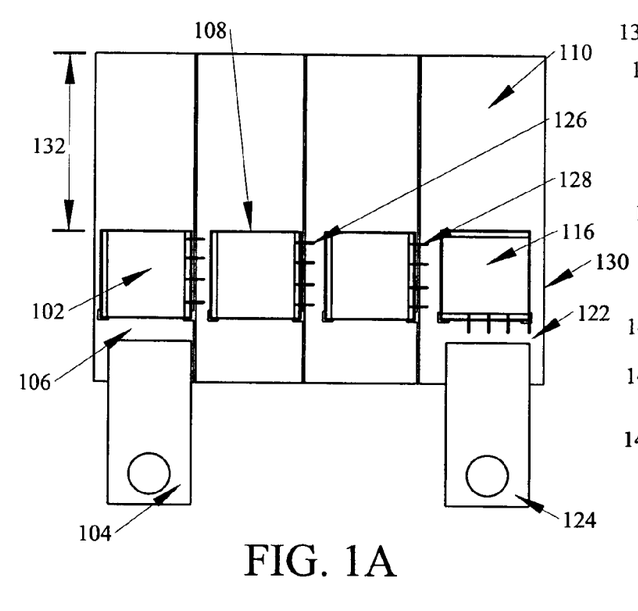
FIG. 1A is a top view of a four section (sided) folding light recycling cavity optical tunnel integrator of the present invention.

FIG. 1A shows a plan view of the planar metal coated substrate with four sections for forming both the light recycling cavity and an optical tunnel integrator. The metal coating on the substrate forms both the electrical connection to the LEDs and also acts as a hinge to form the foldable cavity. In this invention, the metal also acts as a mirrored surface to form the reflecting interior faces of the optical tunnel taper at one end. The metal is patterned to form a series or parallel interconnect arrangement between LEDs mounted onto the substrate at the other end. The substrate is made significantly longer in dimension at the output side of the light recycling cavity 110. In this extended area 110, a dielectric mirror or protected metal mirror is coated. This mirror coating may be added to the metal coating, which forms the electrical interconnect and hinge, by physical vapor deposition, sputtering, electroplating, etc.

Alternatively, a single metal may be used to form the mirror, electrical interconnect, and hinge. Preferably this mirror coating is silver. Silver has a very high reflectivity. Silver has been demonstrated to be a reliable metal for wirebonding or soldering electrical interconnects. In the areas where there are no electrical interconnects, the silver is preferably coated with a thin insulating material such as silicon dioxide, silicon monoxide, calcium fluoride, magnesium fluoride, etc. These materials are deposited at preferably a quarter of the wavelength thickness to the wavelength of the light of interest to protect the reflecting metal, such as silver, aluminum, etc., from oxidation or tarnishing.

The positive lead or electrical connection to the first LED 102 in FIG. 1A in the cavity is made with a wire or electrical conducting tab 104 that is soldered to metal island 106. Metal island 106 makes contact to the anode (bottom) of LED 102. The top (cathode) of LED 102 makes contact to metal island 108 via the wirebonds 110. This interconnect method is continued for LEDs 112, 114, and 116 using metal islands 118, 120, and 122 and wirebonds 126, 128, and 130 with the external negative polarity connection to the array of LEDs made through tab 124 which is been soldered to metal island 122.

The substrate is preferably an insulator with high thermal conductivity such as aluminum nitride. The substrate protrudes beyond the upper edge of LEDs 102, 112, 114, and 116 and with its mirrored surface forms an optical tunnel when folded of sufficient length 132 to homogenize the light exiting the cavity.

Figure 1B:
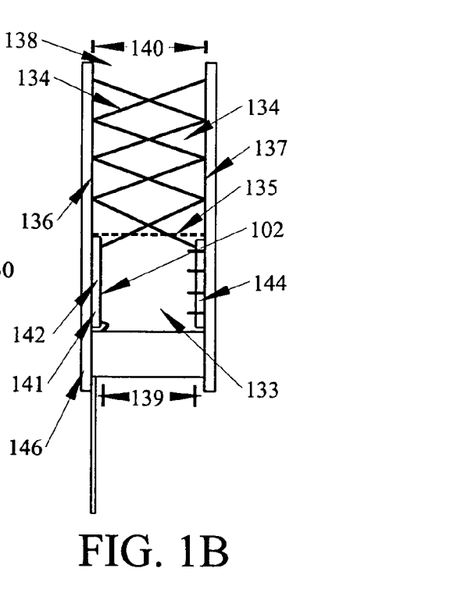
FIG. 1B is a cross-sectional view of a four sided folding light recycling cavity optical tunnel integrator of the present invention.

FIG. 1B shows how light rays 134 that exit the light recycling cavity are reflected with multiple bounces off the mirrored surfaces 136 until when they exit 138 the cavity they are fully spatially mixed. The exit of the optical tunnel will have a Lambertian (180°) light distribution identical to the exit aperture of the LED light recycling cavity 135 since the mirrored surfaces 136 and 137 are parallel to each other. Further, the angular non-uniformities in the light beam are not altered either. This method of construction forms a fully aligned optical tunnel integrator and light recycling cavity using one piece construction and very few processing steps.

It should be noted that some étendue is not preserved due to the construction shown in FIG. 1B. The exit aperture 135 with width 139 is smaller than the width 140 of the exit of the optical tunnel 138. This is due to the thickness 141 of the LEDs 142 and 144 mounted on the inside walls of the reflecting folded substrate 146. This loss of étendue is non-trivial. For example, even with a thin LED that has a thickness of 0.1 mm for a 1 mm square exit aperture, the increase in étendue will be 21%. The increase in étendue is merely the ratio of the area of the exit aperture 138 of the optical tunnel to the area of the exit aperture 139 of the light recycling cavity.

In an additional embodiment of this invention, the étendue in the above example can be preserved. The light recycling cavity and optical tunnel in FIG. 1C have two wedge mirrored surfaces 150 and 152 mounted just outside and adjacent to the exit aperture 135 of the light recycling cavity 139. These two wedge mirrors 150 and 152 have a thickness equal to the LED thickness at the plane of the exit aperture 135 of the cavity. For ease of viewing, FIG. 1C only shows two wedge mirrors instead of the four wedge mirrors to cover all four sides of the cavity.

Figure 1C:
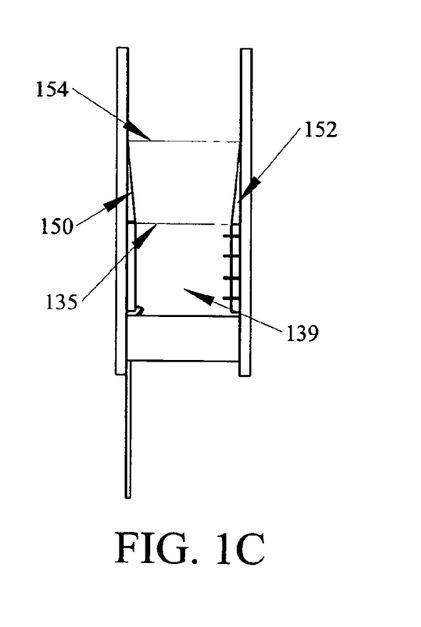
FIG. 1C is cross-sectional view with wedge mirrors of the present invention.

At a distance of approximately 0.73 times the width of the exit aperture of the cavity, the mirror surface 150 and 152 will meet the mirrored surface of the optical tunnel substrate. With this arrangement, the étendue at the output plane 154 is identical to the étendue of the exit aperture of the cavity 135. This is due to any light that is reflected off of the tapered mirrored surfaces is slightly collimated. Therefore, the light angular distribution is narrowed at image plane 154 to within a 120° solid angle (60° half angle). This example assumes an LED thickness of 0.1 mm, a wedge length of 0.73 mm, and a cavity exit aperture width of 1 mm. This novel integrated one piece optical light recycling cavity and optical taper provides a very short form factor with a collimated light output. If the mirrored surfaces 150 and 152 have reflectivities of greater than 98%, then the light exiting the image plane at 154 will be greater than 98% of the light exiting the light recycling cavity. These wedge mirrors are easily fabricated using casting or molding techniques and are applied while the substrate is in planar form. A perspective view of the folded cavity is shown in FIG. 1D.

Figure 1D:
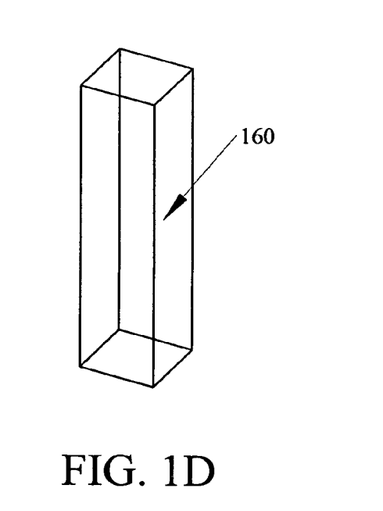
FIG. 1D is a perspective view of a four sided folding light recycling cavity optical tunnel integrator of the present invention.

The aforementioned embodiments create an integrated light recycling cavity in FIG. 1D, and optical tunnel integrator wherein the angular distribution of light emitted from the output of the light recycling cavity is preserved at the output of the optical tunnel integrator. And, a slight collimation of the light in FIG. 1C is provided when exiting the light recycling cavity. However, it is many times desirable to further collimate the light that is emitted by the light recycling cavity to more efficiently couple it into an optical system.

Figure 2A:
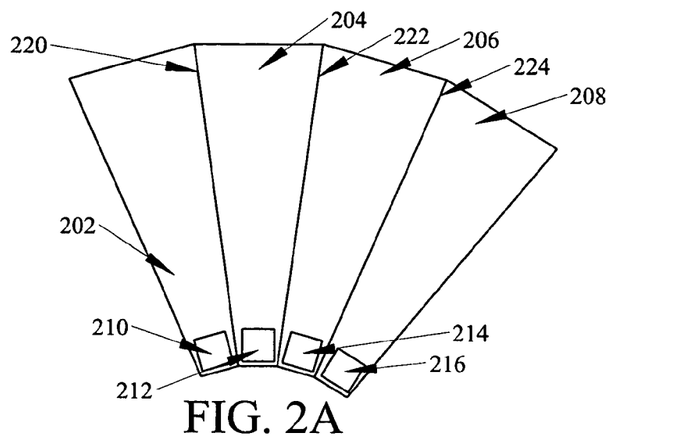
FIG. 2A is a top view of the optical taper (funnel) light recycling cavity substrate in planar form of the present invention.

A foldable light recycling cavity and integrated optical taper in FIG. 2A can be formed that collimates the light exiting the light recycling cavity to any desired angle. A planar four section array substrate prior to folding. LEDs 210, 212, 214 and 216 are mounted on metallized substrates 202, 204, 206 and 208. These separate substrates are formed by scribing a singular substrate from its backside along the dotted lines indicated by 220, 222, and 224. A suitable metal, such as silver, gold, copper, etc., is coated over the entire substrate before scribing. The metal coating is isolated utilizing photolithography and/or a laser to form interconnects to each LED mounted on the substrate. However, the metal is not scribed or patterned where it crosses the scribe lines 220, 222, and 224. The metal, therefore, acts as a hinge so that the four sections can be folded up into a tapered optical tunnel and integrated light recycling cavity.

Figure 2B:
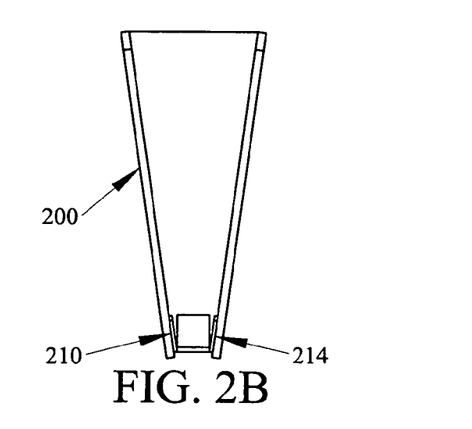
FIG. 2B is a cross-sectional view of the folded integrated optical taper (funnel) LED light recycling cavity of the present invention.

Shown in FIG. 2B is a cross-sectional view of the folded integrated light recycling cavity and optical taper 200. The LEDs 210 and 214 are angled relative to each other, therefore, forming a mini-optical taper collimator within the light recycling cavity. Since the étendue of the light recycling cavity is determined by the area of the output aperture, it would appear that the étendue of the light recycling cavity depicted in FIG. 2 is larger than the light recycling cavity depicted in FIG. 1. However, since the light emitted within the light recycling cavity is altered and collimated by the optical tunnel (taper), this offsets the increase in area, therefore, preserving the étendue, which would be attained with a rectilinear light recycling cavity as depicted in FIG. 1. The degree of collimation is determined by the angle of the LED faces to a normal of the bottom of the cavity and the amount of specular reflectivity of the LEDs. If the LEDs only have diffused reflectivity, then there is no collimation of the light within the light recycling cavity. Further, light emitted from the LEDs that does not strike or reflect off other LEDs or other tilted surfaces within the cavity undergoes no partial collimation, therefore, the amount of collimation within the cavity is relatively small.

There is, however, compensation for opening the output aperture of the light recycling cavity. Typically, if the output aperture is increased on a light recycling cavity, the gain of the cavity is reduced, the gain being defined as the ratio of the brightness of the LEDs to the brightness of the cavity. However, although the gain is reduced, the efficiency of the cavity improves, the efficiency being defined as the total amount of light emitted by the cavity divided by the total amount of light emitted by all of the LEDs within the cavity. The integrated optical taper light recycling cavity has many advantages including ease of assembly and eliminating the requirement of mounting, positioning, and aligning an optical tunnel or taper to the output of the light recycling cavity.

Figure 2C:
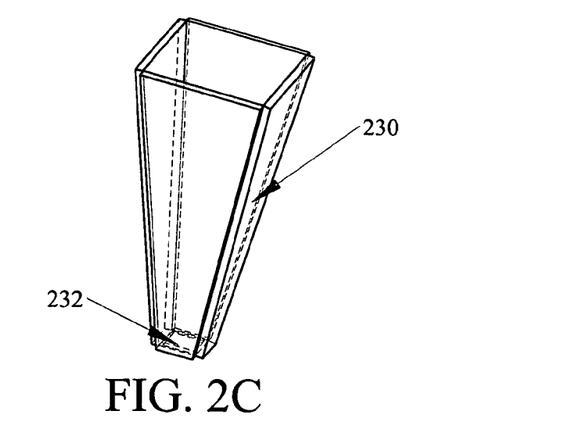
FIG. 2C is a perspective view of the folded LED light source and optical taper (funnel) of the present invention.

To complete the folded optical tunnel and integrated light recycling cavity 230 in FIG. 2C, an additional LED 232 may be mounted on the bottom of the light recycling cavity. Alternatively a high reflectivity material such as Spectralon, barium sulfide, or specular mirrored surface may be mounted as a base plate on the bottom of the light recycling cavity.

Figure 3A:
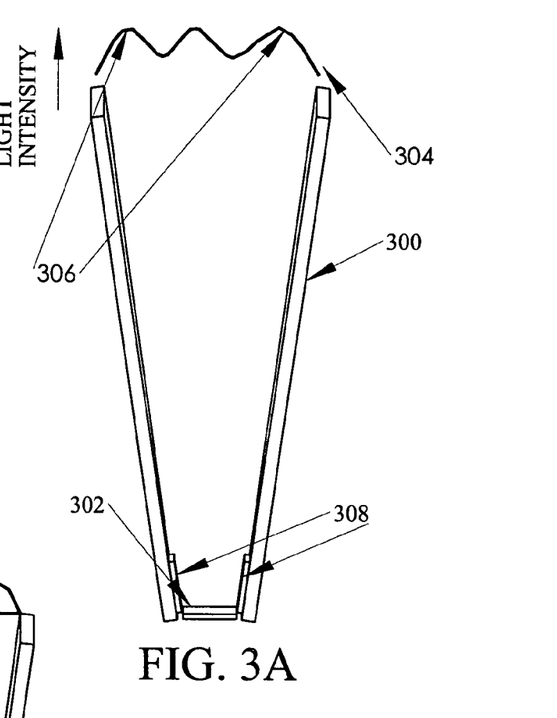
FIG. 3A is a cross-sectional view of two sides of the optical taper light recycling cavity with a flat reflective bottom of the present invention.

One problem with this arrangement is that the emission pattern from the cavity may not be totally lambertian and may have peaked side lobes. A representative light intensity graph 304 is shown in FIG. 3A across the output of the taper of the integrated tapered cavity 300 with a flat highly reflective bottom 302. By placing a pyramid with highly reflecting sides, such as silver with SiO2 coating, on the bottom of the cavity a uniform light output can be achieved eliminating the side lobes 306 created by the LEDs 308 placed around the inside vertical walls of the cavity.

Figure 3B:
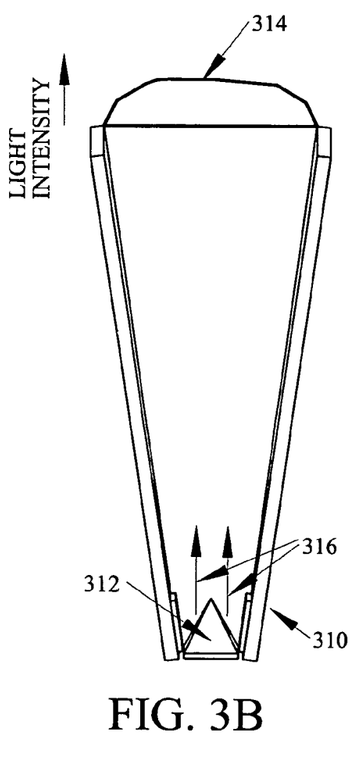
FIG. 3B is a cross-sectional view of two sides of the optical taper light recycling cavity with a reflecting pyramid bottom of the present invention.

An integrated tapered light recycling cavity 310 with a reflecting pyramid 312 and a light intensity graph 314 output from such an arrangement is shown in FIG. 3B. The pyramid 312 also improves the extraction efficiency of the cavity. Typically, the LEDs 316 do not have as high a reflectivity as the other optical elements inside the cavity. By placing the pyramid 312 at the bottom of the cavity, light rays 316 that would be emitted from LEDs on one side of the cavity and directed at LEDs on the other side of the cavity are intercepted by the pyramid 312 which can have reflectivity of greater than 98% and then specularly reflected and collimated toward the output of the cavity.

Figure 3C:
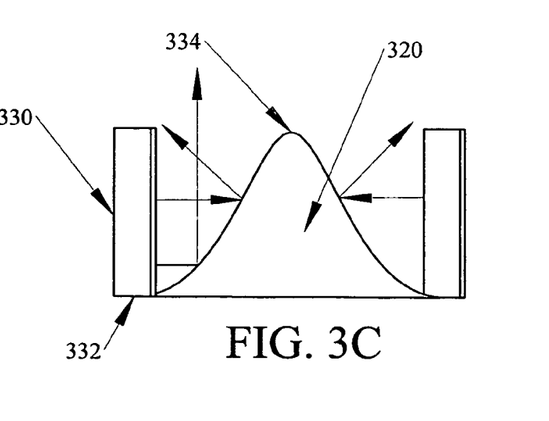
FIG. 3C is a cross-sectional view of two sides of the optical taper light recycling cavity with a parabolic cone reflector mounted on the bottom of the cavity of the present invention.

A parabolic pyramid 320 in FIG. 3C directs light out of the cavity. This parabolic curve has a surface, which is normal to the bottom LED 330 at the bottom of the pyramid 332, and gradually slopes up to the top of the pyramid 334. The pyramid can be made of quartz, glass, sapphire, molded plastic, metal, etc. and coated with a highly reflecting material such as silver. Alternatively, the pyramid may be coated with a multilayer dielectric reflector as well known in the art.

Figure 4A:
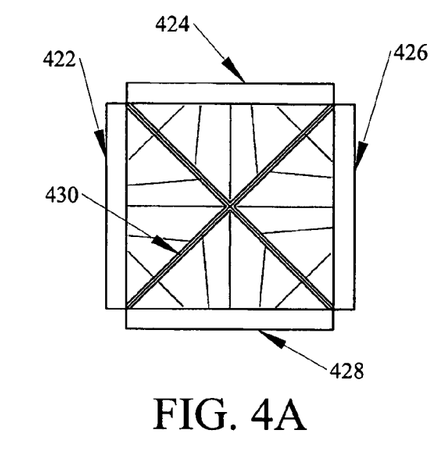
FIG. 4A is a perspective view of the four quadrant curved reflector mounted on the bottom of the cavity of the present invention.
Figure 4B:
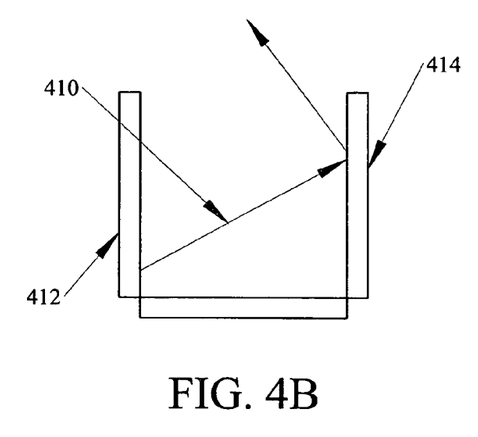
FIG. 4B is a cross-sectional view of two sides of the optical taper light recycling cavity with a four quadrant curved reflector mounted on the bottom of the cavity of the present invention.

It is sometimes advantageous to combine multiple colors in a light recycling cavity, as in U.S. Pat. No. 7,048,385. A light recycling cavity can have two green LEDs 422 and 424, one red LED 426 and one blue LED 428 as shown in FIG. 4A. However, to achieve a high efficiency of light output from the light recycling cavity, high reflectivity on all interior surfaces of the cavity is required. This high reflectivity is a problem when mixing LEDs of different colors. For example, light emitted by red LEDs have reflectivities of around 30 to 40% of light emitted by the blue and green LEDs. As depicted in FIG. 4B, a light ray 410 emitted by a green LED 412 is incident on the red LED 414, however, only about 35% of the light incident on the red LED is reflected back into or out of the cavity. This low red light reflectivity can significantly impact the light output efficiency of the cavity.

Figure 4C:
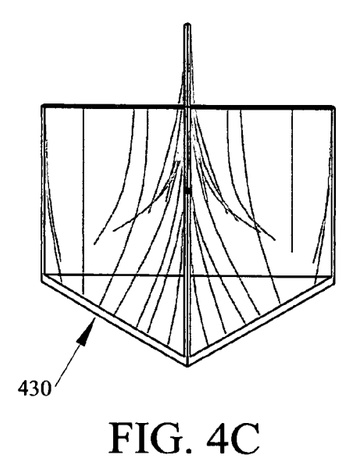
FIG. 4C is a perspective view of the four quadrant curved reflector of the present invention.

To overcome this low red light reflectivity, a multifaceted reflector keeps all of the light within the cavity restricted to each respective LED and facilitates mixing and homogenizing all of the colors. The multifaceted reflector is a four quadrant compound parabolic reflector 430 as depicted in FIG. 4C. This reflector, which is fabricated by molding or electroforming, has a reflective surface similar to the one depicted in FIG. 3C in that the reflective surface that meets the bottom of the LED is perpendicular to the emitting surface of the LED. This surface then is curved upward and slopes to the top edge of this four quadrant reflector. The top edges are coplanar with the top edges of the LEDs making up the light recycling cavity.

This multifaceted reflector is shown dividing up the cavity into quadrants 430 in FIG. 4A. Therefore, no light emitted by any individual LED inside the cavity can reach any of the other LEDs inside the cavity. This compound reflector, however, not only separates the light but it also partially collimates the light directing it toward the output of the cavity. This compound parabolic four quadrant reflector can be utilized in a rectilinear light recycling cavity or an integrated optical taper light recycling cavity as previously described.

In addition to the configuration of a multi-colored light recycling cavity depicted in FIG. 4A which contains the colors red, green, and blue, one of the green LEDs can be exchanged for a blue LED with a wavelength conversion material, as described in U.S. Pat. No. 7,285,791, on its output face to produce yellow, cyan, etc. This configuration would provide a four color light recycling cavity, all with high reflectivity.

Figure 4D:
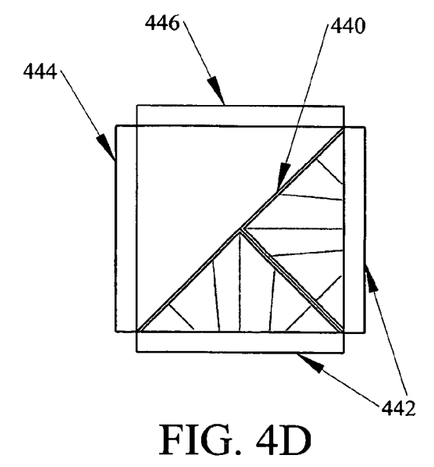
FIG. 4D is a plan view of a three quadrant curved reflector mounted on the bottom of the cavity of the present invention.

Another alternative embodiment is to modify the four quadrant compound parabolic reflector to create a three quadrant compound parabolic reflector 440. This is depicted in FIG. 4D wherein the two green LEDs are placed adjacent to each other. The compound parabolic reflector, therefore, separates the red LED 444 and the blue LED 446 from the others, but the two green LEDs 442 are mixed with each other.

Figure 5A:
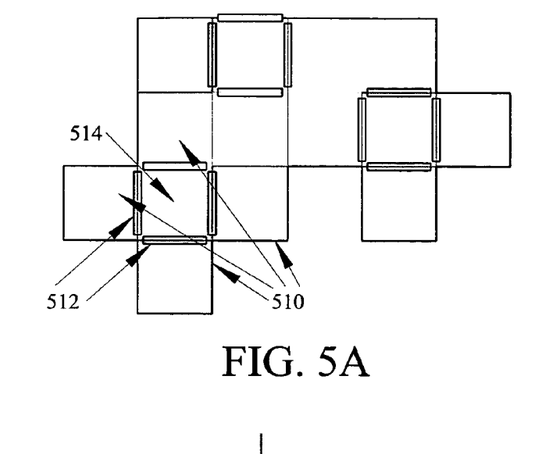
FIG. 5A is a top view of an unfolded five sided recycling LED light cavity prior to wafer dicing of the present invention.
Figure 5B:
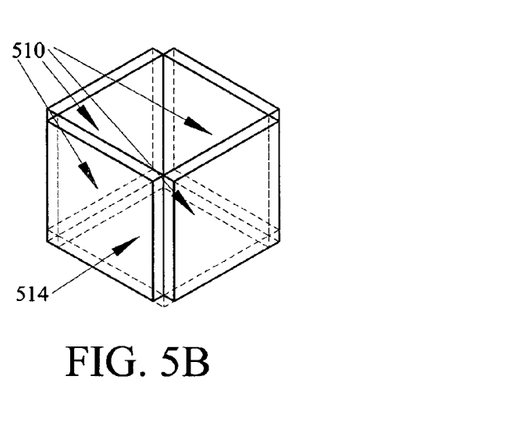
FIG. 5B is a perspective view of a five sided recycling LED light cavity of the present invention.

A further embodiment of this invention greatly simplifies construction of the light recycling cavity. As shown in FIG. 5A, the LEDs 510, which are to be used inside the light recycling cavity are metallized, at the wafer level, interconnecting adjacent LEDs with a thin metal hinge 512 on top of the output face of the LED. The hinge pattern shown in FIG. 5A would form a five sided light recycling cavity when folded as shown in FIG. 5B, with LED 514 on the bottom of the cavity. The wafer is scribed from the backside with a scribe or wafer saw or preferably with an excimer laser, but not all the way through to the topside metal. The patterned metal forming the hinges can be made using conventional wafer lithography and etching processes.

Figure 5C:
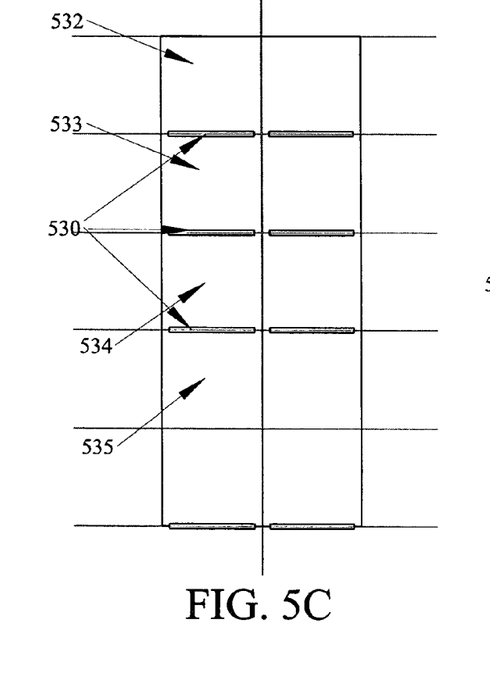
FIG. 5C is a perspective view of a four sided light recycling cavity on a gallium nitride wafer prior to dicing of the present invention.
Figure 5D:
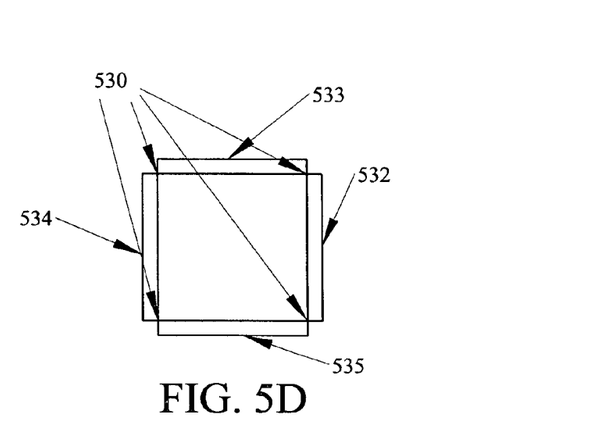
FIG. 5D is a cross-sectional top view of the four sided light recycling cavity of the present invention.

To form a four sided cavity, open bottom metal hinges can be located as shown in FIG. 5C. Four hinges 530 are located in line connecting LEDs 532, 533, 534, and 535 in FIG. 5D. In U.S. patent application Ser. No. 12/148,888 and U.S. provisional application 61/067,935, a method is shown to produce substrate-less LEDs. This method can be combined with the aforementioned embodiments to form a substrate-less integrated light recycling cavity.

Figure 6A:
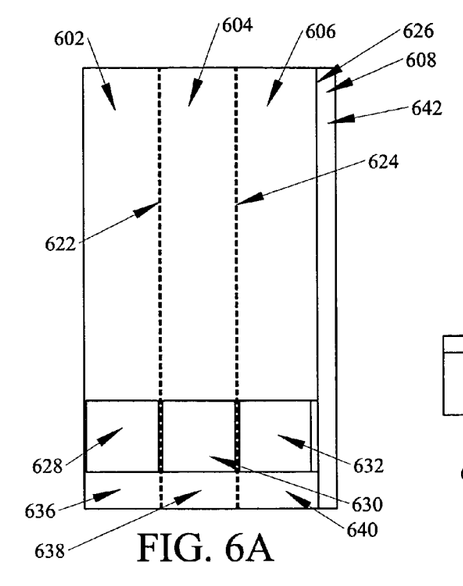
FIG. 6A is a perspective view of an unfolded light recycling cavity with integrated reflectors of the present invention.

Another method for forming an integrated light recycling cavity with integrated optical taper is shown in FIG. 6A. A foldable glass taper has three segments 602, 604, 606 unfolded and one segment 608 folded. The glass taper consists of a glass substrate with a reflective metal film 610 coated on the top surface of a glass or ceramic substrate 612. The reflective metal film 610 can be silver, aluminum, etc. The substrate is scribed or cut on the backside 614 616, 618 with a laser or a saw. The substrate is only partially scribed or broken so as to keep the metal film intact such that it can act as a hinge 620 and the assembly to be folded into an optical tunnel. The mirrored faces 602, 604, 606 can be folded along the dotted lines 622, 624, 626. LEDs 628, 630, 632, 634 are attached to a metal coated, thermally conducting submount 636, 638, 640, 642. The metal coated submount can be aluminum nitride, copper, etc.

Figure 6B:
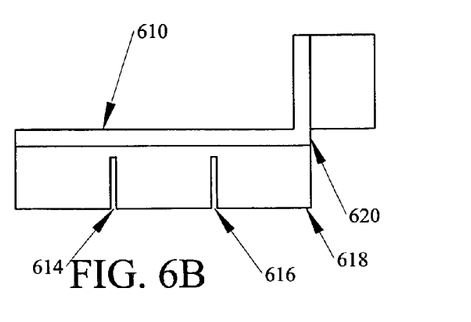
FIG. 6B is a cross-sectional view of foldable optical taper face up with one quadrant folded of the present invention.

FIG. 6B shows the mirrored surfaces of the foldable optical taper face up with one quadrant folded. Another mirrored substrate made out of glass, plastic, flexible circuit, or metal clad PCB, and preferably having the same thickness as the LEDs, is bonded to the extended portion of the thermally conductive submount. The mirrored substrate is scribed from the backside and then can be folded on the silver reflective film or underlying metal film making up the reflective front surface as discussed previously.

LEDs 610, 612, 614, and 616 are mounted onto a thermally conductive substrate 618 of aluminum nitride, alumina, copper tungsten, beryllium oxide, or diamond. The foldable mirrored substrate, which will form the optical tunnel, is also mounted onto the substrate. The substrate is then scribed and broken along the same lines as the mirrored substrate hinges. The taper is then folded into a combination light recycling cavity and optical tunnel. The LEDs are then coincident with the surface of the reflective portion of the optical tunnel. Since the optical tunnel is folded on the front side of the LEDs, no gap occurs between the LEDs. Therefore, the LEDs, when placed on the substrate, can be mounted in close proximity further improving the efficiency of the light recycling cavity.

Figure 6C:
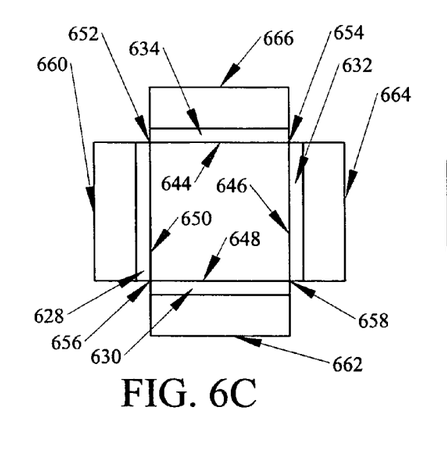
FIG. 6C is a top view cross-section of the folded four sided cavity and optical integrator of the present invention.

FIG. 6C shows the integrated optical tunnel light recycling cavity folded in a cross-sectional view looking down into the cavity. The LEDs 628, 630, 632, 634 are coincident with the reflective surface of the optical tunnel since the reflective surface 644, 646, 648, 650 is fabricated with a thin metal film that can be hinged on this thin metal film 652, 654, 656, 658. To complete the assembly, the folded cavity is inserted into a heatsink wherein the backside surfaces of the thermally conductive substrate 660, 662, 664, 666 are bonded or eutectically soldered to the inside surfaces of the heatsink or head spreader, which is fabricated from copper, aluminum, or some other suitable highly thermally conductive material.

Figure 6D:
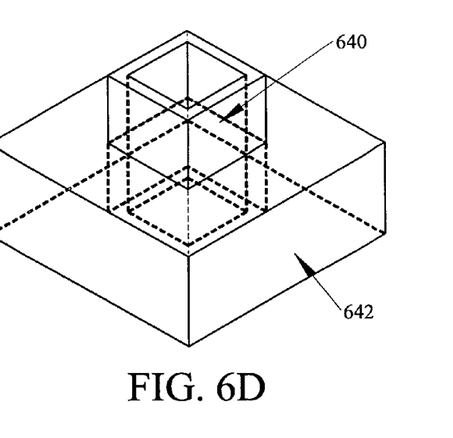
FIG. 6D is a perspective view of the folded optical light recycling cavity with optical integrator mounted in a heatsink of the present invention.

The integrated optical taper light recycling cavity 640 in FIG. 6D is mounted in the heatsink 642.

Figure 7A:
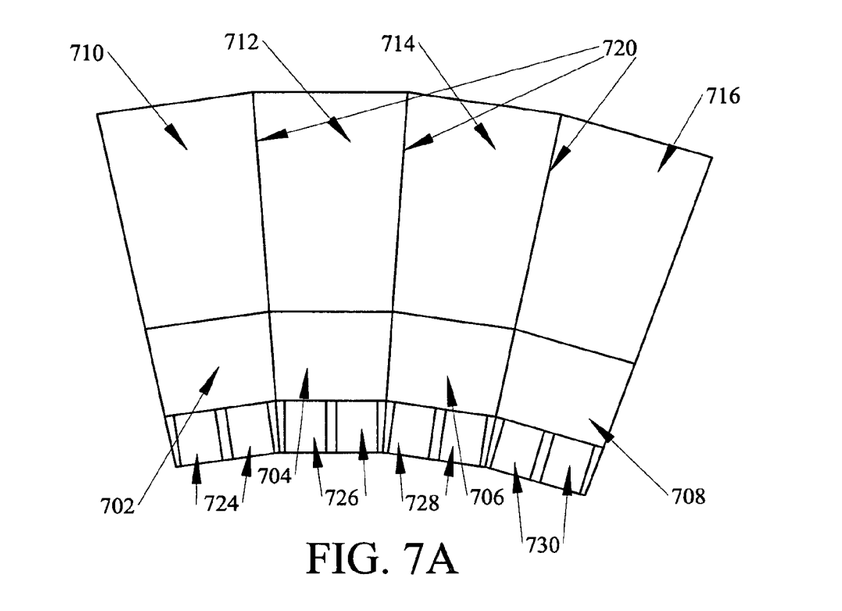
FIG. 7A is a perspective view of an unfolded integrated optical funnel and light recycling cavity made entirely on gallium nitride epichips of the present invention.
Figure 7B:
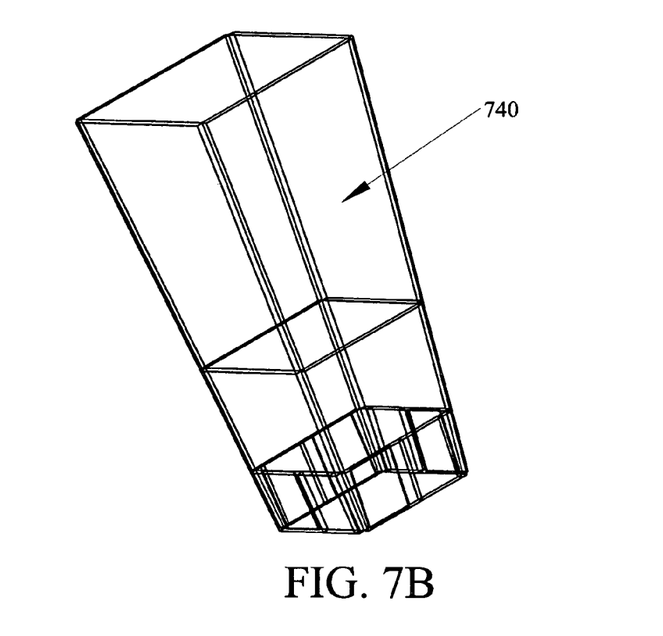
FIG. 7B is a perspective view of a complete integrated optical funnel and light recycling cavity made entirely with substrate-less gallium nitride ready to be placed into a receptacle heatsink of the present invention.

By combining techniques shown in FIG. 2, FIG. 5 and FIG. 6, a tapered optical light pipe can be fabricated where the hinges or folds are made on the top of the LEDs and reflective surfaces of the optical taper. Shown in FIG. 7A is a method utilizing epichips as described in U.S. patent application Ser. No. 12/148,888 and U.S. provisional application 61/067,935, which further simplifies the process of making an integrated light recycling cavity and optical light funnel or taper. On a thick (greater than 10 microns) gallium nitride wafer, LEDs are formed in the areas 702, 704, 706 and 708. Areas 710, 712, 714 and 716 are coated with a multilayer dielectric reflective film or a protected metal reflective film. Since the emitting surface of the LEDs 702, 704, 706 and 708 lie on the same surface as the reflecting surfaces 710, 712, 714 and 716, very efficient optical coupling is achieved when folded into an optical funnel or taper. Metal hinges are deposited underneath the reflective film along the lines separating the four quadrants of the epichip integrated optical funnel and light recycling cavity. Connections to the LEDs are simplified by utilizing extended area below the LED 724, 726, 728, and 730. This eliminates the wirebonds that normally would be required to interconnect the LEDs from interfering with the reflective bottom that is placed in the folded optical cavity. A perspective view of the folded optical cavity and light funnel 740 is shown in FIG. 7B ready to be placed into a receptacle heatsink.

Figure 8:
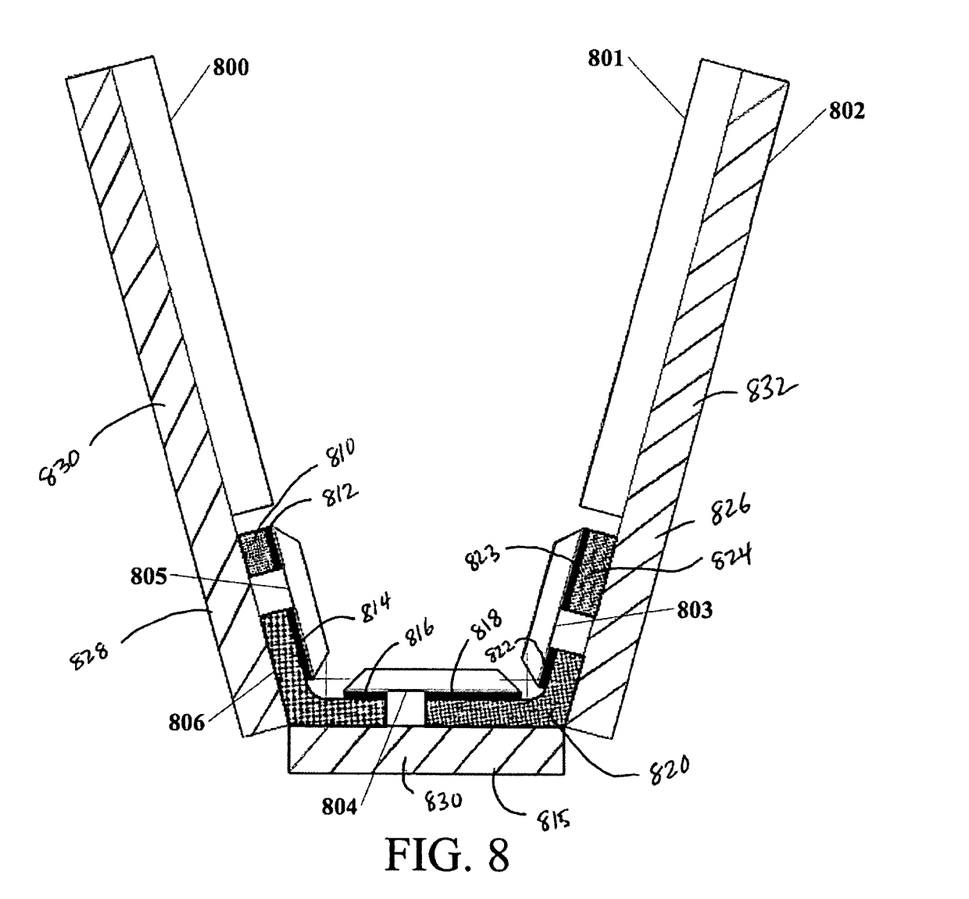
FIG. 8 is a cross-sectional side view of foldable recycling optical cavity with an integral taper containing direct attach die of the present invention.

FIG. 8 depicts a cross-sectional view on a recycling optical cavity with integrated optical collimator. Reflective elements 800 and 801 are attached to foldable interconnect 802. The foldable interconnect is a metal layer deposited on a ceramic substrate or a laminate or a flex circuit and is patterned to form the interconnect between the LEDs. The foldable interconnect forms the hinge for folding into a cavity. After folding, an optical taper is formed which collimates and mixes the light emitted from the direct attach LED 803, 804 and 805. The direct attached LEDs (e.g. Cree DA 1000 LEDs) or suitable surface mount light emitting diodes facilitate a simpler and more elegant way of interconnecting the LEDs within the light recycling cavity without having wire bonds above the light emitting surfaces. If wire bonds are used to interconnect the LEDs, the gold utilized in the wire bonds absorbs the light emitted by the LEDs and reduces the efficiency of the light recycling cavity. Wire bonds are eliminated using direct attach LEDs as all of the electrical interconnections are made on the bottom or reflective side of the LEDs.

As depicted in FIG. 8, a metal patterned contact pad on the ceramic substrate of the foldable interconnect or a folding laminate 810 is connected to the anode contact on the direct attached LED 805. The LED is bonded to the contact pad and substrate via soldering, thermal compression bonding, or metallized epoxy. At the same time this bond is made, the cathode contact 814 of LED 805 is connected in a similar manner to the metal pad acting as a hinge 806. This metal hinge 806 also acts as the anode contact to LED 804 connecting to anode contact pad 816. Similarly cathode contact 818 makes contact to metal hinge 820 which makes contact to the anode connection 822 on LED 803 with its cathode connected to pad 824 on substrate 802. this connects LEDs 805, 804, and 803 in series. This configuration simplifies the interconnect to the light recycling cavity and eliminates any wires required to interconnect the LEDs. This configuration also can provide higher efficiency to the light recycling cavity by eliminating the gold wires used in wire bonding conventional LEDs. These wires block and absorb visible light generated by the LEDs. As previously disclosed, the radiance within such a recycling optical cavity can be enhanced relative to the radiance of an individual LED if absorption losses are minimized. In addition to mechanically positioning the reflective elements 800 and 801, the foldable interconnect 802 mechanically positions and electrically interconnects direct attach LED die 803, 804, and 805. A low cost recycling optical element can be manufactured by this approach.

To operate the three LEDs depicted in FIG. 8, a positive voltage (for Cree DA 1000 LEDs 3.15 V is the typical forward voltage) of ~9.45 V would be applied to interconnect 810 and the return or ground connected to contact 824. These two contacts can be electrically connected or brought out from inside the cavity with through hole vias 826 and 828 in the insulating substrates 830 and 832.

Figure 9:
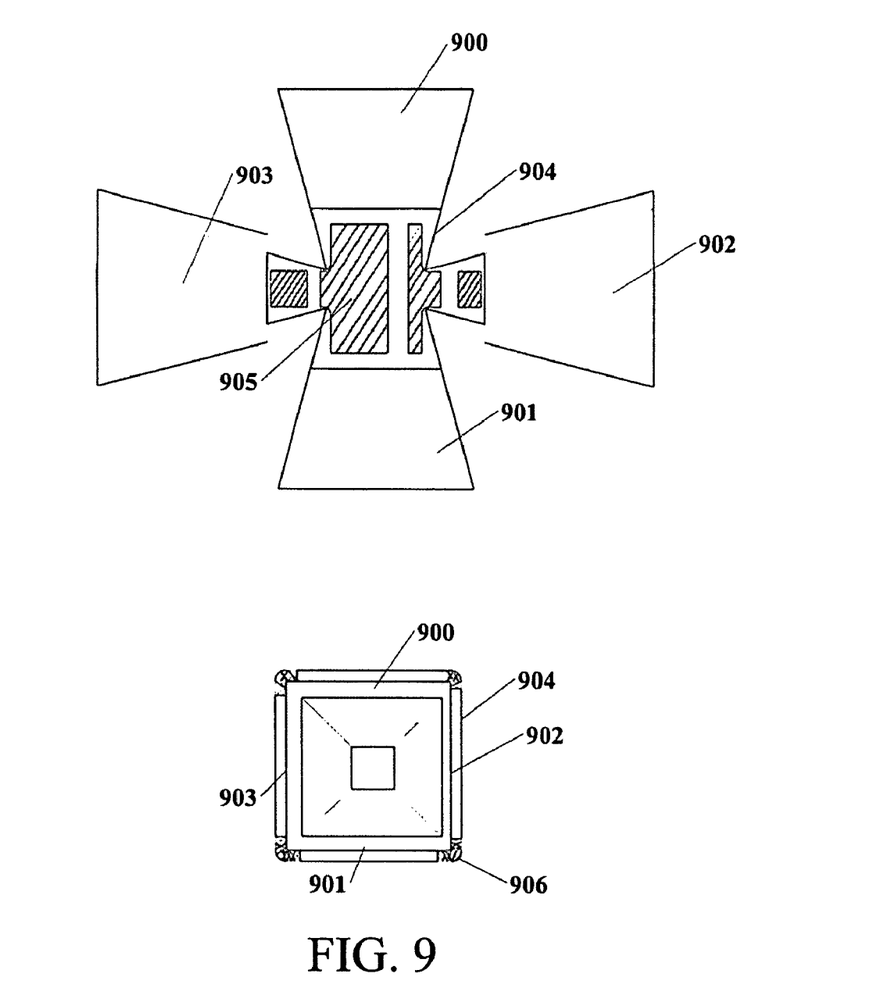
FIG. 9 is a top view of a foldable five sided substrate with interconnect and reflective elements of the present invention.

FIG. 9 depicts a foldable interconnect 904 with reflective elements 900, 901, 902, and 903 mounted onto foldable interconnect 904. Reflective elements 902 and 903 extend past the foldable interconnect 904 such that upon folding the folded top down and bonding material 906 can be applied to hold the assembly in place. Interconnect 905 again allows for both interconnect of the direct attach LED but also forms the hinge that holds the foldable interconnect 904 together. As an example, Silflex mirrors 250 micron thick with 99% reflectivity are cut to correspond to the shapes of reflective elements 900, 901, 902, and 903 respectively. When folded these highly reflective elements form a miniature collimating optical taper. The highly reflective elements are bonded onto foldable interconnect 904 using an adhesive layer. Upon folding, a UV curable epoxy is used as bonding material 906 to hold reflective elements 900, 901, 902, and 903 as shown in the folded top down view. External interconnects and thermal conduction cooling means are further attached after folding of the finished device.

Figure 10:
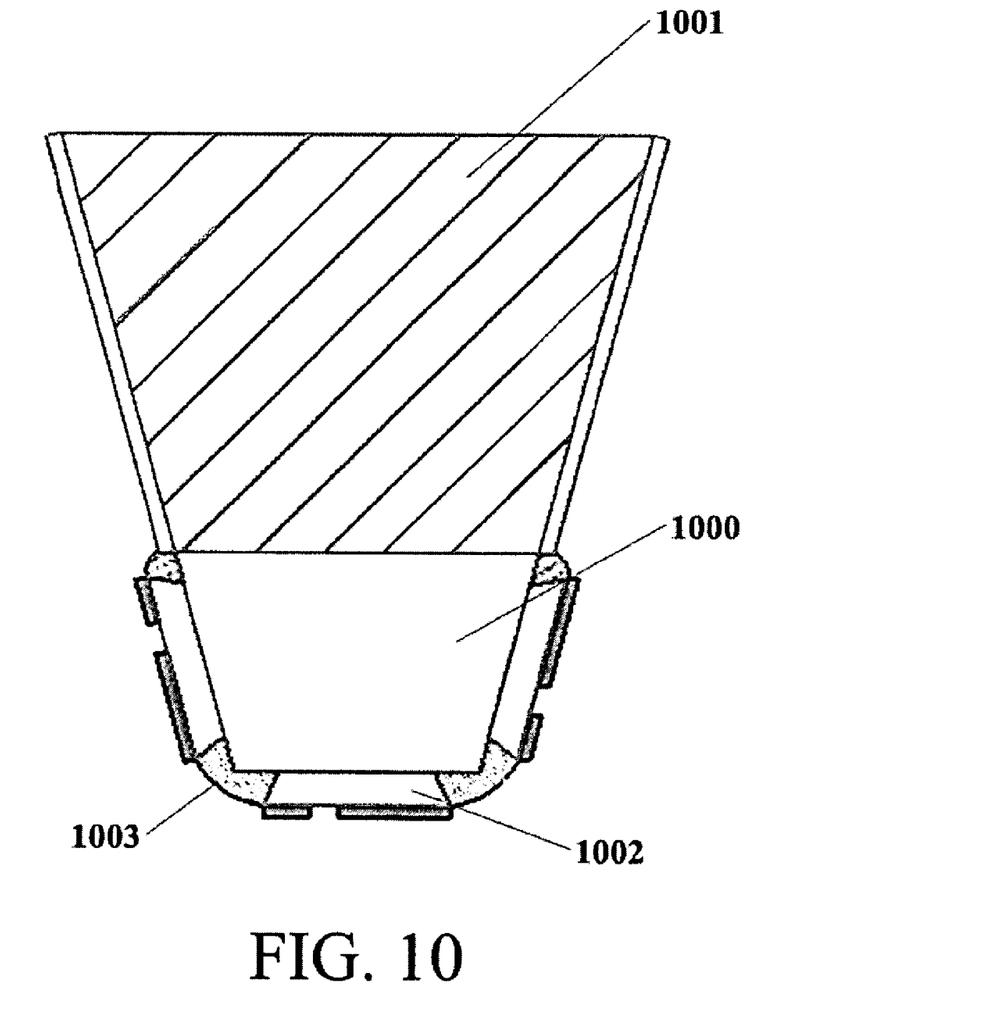
FIG. 10 is a side view of a solid tapered wavelength conversion element with at least one direct attach LED die thermally and optically mounted to the wavelength conversion element of the present invention.

FIG. 10 depicts a tapered solid wavelength conversion element 1000 onto which at least one direct attach LED 1002 is attached. The direct attach LED 1002 may be surface mounted or recessed into a pocket within the tapered solid wavelength conversion element 1000 and further be held in place using a bonding adhesive 1003. Optionally, the tapered solid wavelength conversion element 1000 may be at least partially coated with a reflective layer 1001 so that at least partial collimation of light emitted by the light emitting diodes and reflected within the optical taper occurs. As an example, a single crystal CeYag doped to 0.1% Ce is cut in the shape of a truncated taper to form tapered solid wavelength conversion element 1000. Reflective layer 1001 is a multilayered enhanced reflectivity aluminum coating tuned for 550 nm wavelengths, coating on at least four sides of the truncated taper and patterned such that light emitted from the at least one blue direct attach LED 1002 can couple into the truncated taper and the excited light from the CeYag to directed out the end of the taper. The wavelength conversion element will convert a portion of the light of a wavelength emitted by the multiple direct attach light emitting diodes into light of a different second wavelength which will exit the light taper.

Figure 11A:
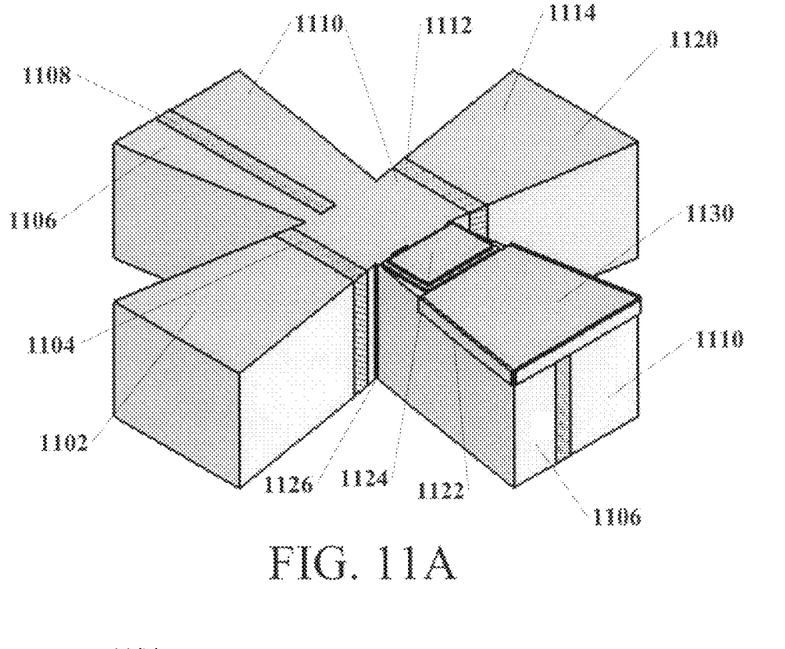
FIG. 11A is a perspective view an unfolded integrated optical funnel and light recycling cavity using a laminate of the present invention.
Figure 11B:
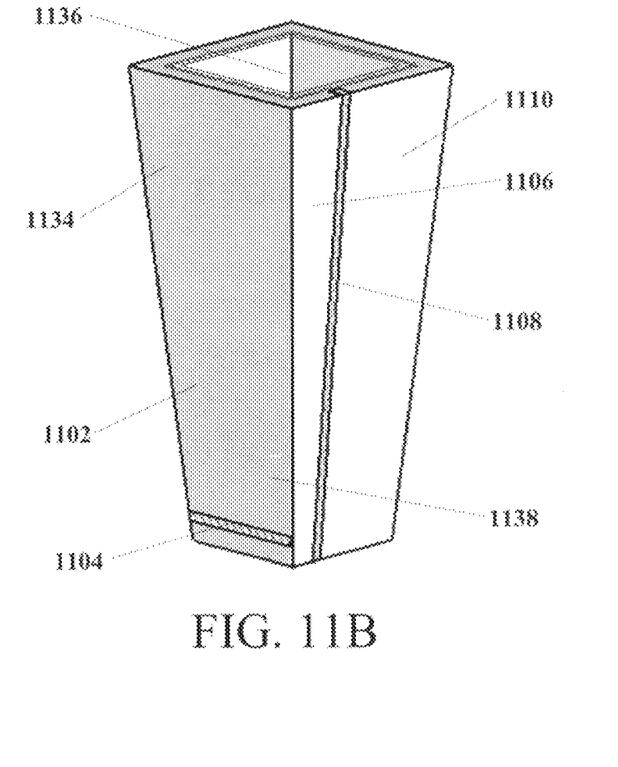
FIG. 11B is a perspective view of complete integrated optical funnel and light recycling cavity using a laminate of the present invention

An alternative method of fabricating a light recycling cavity with appended optical element is shown in FIG. 11A and FIG. 11B. A laminate consisting of a thick metal layer 1102, a dielectric material layer 1104, a thin metal layer 1106, a dielectric layer 1108, a thick metal layer 1110, a dielectric layer 1112, and thick metal layer 114 is fabricated. The metal layer consists of copper, silver, or other thermally and electrically conductive material. The dielectric consists of an organic or in organic insulator material, for example, polyimide, mylar, polysilazane, or glass or ceramic. This insulating material does not have to be thermally conductive as layers of 1102, 1106, 1110, and 1114 have sufficient area to conduct away the heat generated by the LEDs that will be mounted on them.

Shown in FIG. 11A, the direct attach or surface mount LED 1124 (only one LED is shown here as an example) is attached to the laminate while the laminate is still in a planar form. The laminate is cut mechanically or by laser or other means at the cut lines 1126, and into a cross pattern as shown to allow it to be folded into a light recycling cavity with tapered or larger area cross-section at its output 1136 than the exit area at the LED mounting positions 1138. The laminate may be coated with a highly reflective layer utilizing aluminum evaporation, silver plating, etc. in the extended area 1130 beyond where the LEDs are mounted. Alternatively, highly reflective mirrors fabricated on glass or metal may be attached to the laminate as shown in element 1130. this mirrored surface is also applied to the other three legs of the cross pattern.

The metal areas may contact with the anode and cathode contact pads on the direct attached LED similarly as discussed previously. However in this case the metal areas extend to the outside of the folded up tapered light recycling cavity shown in FIG. 11B, thereby making it very easy to make electrical connection to the LEDs. For example the anode connection to LED 1124 is done by metal layer 1110 and the cathode connection is made on metal layer 1106. The dielectric layer 1108 isolates these two metal layers. A connection to the LED mounted to tapered side 1134 is made via metal layer 1102, the cathode connection is made via metal layer 1106. Having all of the connections brought out to the outside of the cavity allows the LEDs inside the cavity to be connected in series or parallel arrangements. The other advantage of this arrangement and forming the recycling leg cavity with this thick metal laminate is that very good thermal conductivity between the LEDs and a heat sink can be achieved. The heat sink can be mounted directly to the outside of the tapered cavity.

The laminate can then be folded to form a light recycling cavity 1200 with appended collimating optical element 1202 as shown in FIG. 12.

Any of the other embodiments, elements or methods shown and described herein may be used in combination with this technique of using direct attach or surface mount LED to form recycling light cavities. For example, a Cree direct attach1000 LED or suitable surface mount LEDs may be used in conjunction with any of the previous embodiments shown in FIGS. 1 through seven of this disclosure.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A light recycling cavity with integral light taper comprises
    a foldable connector having a first side and an opposite second side; multiple metal patterned contact pads on said first side of said foldable connector;
    multiple reflective elements mounted on said first side of said foldable connector,
    at least three cut channels in said second side of said foldable connector; said at least three cut channels forming at least three fold lines on said first side of said foldable connector;
    multiple direct attach light emitting diodes mounted on said multiple metal patterned contact pads of said first side of said foldable connector; one multiple direct attach light emitting diode on one metal patterned contact pads; and
    wherein folding said foldable connector along said three fold lines forms a four sided light recycling cavity at said first end and a light taper at said second end, said foldable connector acts as a hinge during folding said foldable connector and said reflective elements and said foldable connector forms the walls of said light recycling cavity and said light taper, light emitted by said multiple direct attach light emitting diodes exiting at said second end.

2. The light recycling cavity with integral light taper of claim 1 wherein light emitted by said light emitting diodes is fully spatially mixed when exiting from the light taper at said second end.

3. The light recycling cavity with integral light taper of claim 1 wherein bonding material is applied to said four sided light recycling cavity to hold said four sided light recycling cavity in place.

4. The light recycling cavity with integral light taper of claim 1 wherein said reflective elements are Silflex mirrors.

5. The light recycling cavity with integral light taper of claim 1 wherein each of said multiple direct attach light emitting diodes are surface mounted within a wavelength conversion element such that a portion of the light of a first wavelength emitted by the multiple direct attach light emitting diodes is converted into light of a different second wavelength exiting at said light taper.

6. The light recycling cavity with integral light taper of claim 1 wherein each of said multiple direct attach light emitting diodes is recessed within a wavelength conversion element such that a portion of the light of a first wavelength emitted by the multiple direct attach light emitting diodes is converted into light of a different second wavelength exiting at said light taper.

7. The light recycling cavity with integral light taper of claim 1 wherein said foldable connector is a metal layer of a ceramic substrate, a laminate or a flex circuit.

8. The light recycling cavity with integral light taper of claim 1 wherein said light taper is tapered outward from said light recycling cavity to collimate the light emitted by said direct attach light emitting diodes when exiting at said second end.

9. The light recycling cavity with integral light taper of claim 1 further comprising
    a reflective base plate covers the open end at said first of said light recycling cavity away from said light taper to reflect light towards said second end.

10. The light recycling cavity with integral light taper of claim 1 further comprising
    a reflective pyramid covers the open end at said first end of said light recycling cavity, said reflective pyramid reflecting light from said at least one light emitting diode to said second end.

11. The light recycling cavity with integral light taper of claim 10 wherein said reflective pyramid is a parabolic pyramid.

12. The light recycling cavity with integral light taper of claim 10 wherein said reflective pyramid is a four quadrant compound parabolic reflector, said parabolic reflector partially collimates reflected light towards said second end.

13. A light recycling cavity with integral light taper comprises
    a laminate having a first side and an opposite second side;
    multiple reflective elements mounted on said first side of said laminate;
    at least three cut channels in said second side of said laminate; said at least three cut channels forming at least three fold lines on said first side of said laminate;
    multiple direct attach light emitting diodes mounted on said laminate; and
    wherein folding said laminate along said three fold lines forms a four sided light recycling cavity at said first end and a light taper at said second end, said laminate acts as a hinge during folding said laminate and said reflective elements and said laminate forms the walls of said light recycling cavity and said light taper, light emitted by said multiple direct attach light emitting diodes exiting at said second end.

14. The light recycling cavity with integral light taper of claim 13 wherein said laminate is a first thick metal layer, a dielectric material layer and a second thin metal layer.

* * * * *